United States Patent [19]

Eguchi

[11] Patent Number: 4,862,466
[45] Date of Patent: Aug. 29, 1989

[54] LASER EMITTING APPARATUS WITH TEMPERATURE INTENSITY CONTROL

[75] Inventor: Tatsuya Eguchi, Toyokawa, Japan

[73] Assignee: Minolta Camera Kabushiki Kaisha, Osaka, Japan

[21] Appl. No.: 97,537

[22] Filed: Sep. 16, 1987

[30] Foreign Application Priority Data

Sep. 25, 1986 [JP] Japan ................. 61-227600

[51] Int. Cl.$^4$ ............................................. H01S 3/10
[52] U.S. Cl. ........................................ 372/9; 372/33; 372/38
[58] Field of Search ............... 372/9, 24, 29, 38, 43, 372/33, 34

[56] References Cited

U.S. PATENT DOCUMENTS

| 4,618,958 | 10/1986 | Shibata et al. | |
| 4,713,672 | 12/1987 | Horihata et al. | 372/38 |
| 4,748,633 | 5/1988 | Negishi | 372/29 |
| 4,763,334 | 8/1988 | Shimada et al. | 372/38 |

FOREIGN PATENT DOCUMENTS

| 3325420 | 1/1985 | Fed. Rep. of Germany | 372/29 |
| 0004581 | 1/1979 | Japan | 372/29 |
| 0007489 | 1/1981 | Japan | 372/29 |
| 2025121 | 1/1980 | United Kingdom | 372/29 |
| 2190783 | 11/1987 | United Kingdom | 372/29 |

Primary Examiner—William L. Sikes
Assistant Examiner—B. R. R. Holloway
Attorney, Agent, or Firm—Price, Gess & Ubell

[57] ABSTRACT

A laser emitting apparatus comprising a semiconductor laser and drive unit for applying an excitation current to the semiconductor laser to cause the semiconductor laser to emit a laser beam. A photoreceptor accepts the laser beam and outputs a signal corresponding to the intensity of the laser beam. A first control unit is provided which is operable in response to the signal output from the photoreceptor for controlling the excitation current in order to maintain the laser beam at a predetermined intensity. The apparatus further comprises a unit for outputting an interrupt signal for interrupting the emission of the laser beam, and a second control means unit operable in response to the interrupt signal for reducing the excitation current below a predetermined intensity level regardless of controls effected by the first control unit.

5 Claims, 2 Drawing Sheets

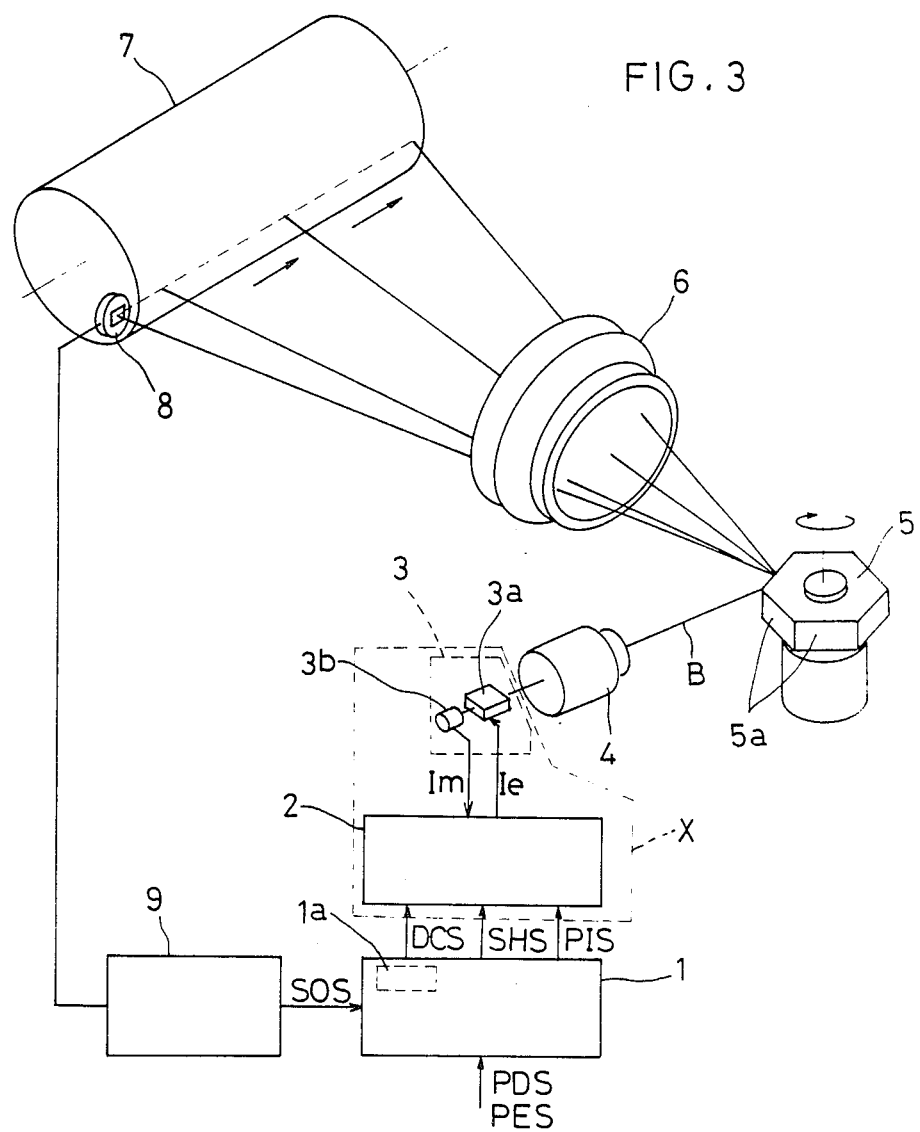

LASER EMITTING APPARATUS WITH TEMPERATURE INTENSITY CONTROL

BACKGROUND OF THE INVENTION

(1) Field of the Invention

The present invention relates to a laser emitting apparatus for use as light source with laser applied machinery such as a laser beam printer, a laser COM (computer output microfilming) system and the like.

More particularly, the invention relates to a laser emitting apparatus comprising a semiconductor laser, a laser drive device for applying an excitation current to the semiconductor laser, photoreceptor means for receiving a laser beam emitted from the semiconductor laser and outputting a signal corresponding to the intensity of the laser beam, and control means operable in response to the signal output from the photoreceptor means for controlling the excitation current so that the laser beam has a predetermined intensity.

(2) Description of the Prior Art

The laser beam printer and laser COM system utilizing the laser beam emitted from the semiconductor laser carries out recording with the laser beam directly modulated on the basis of image information. In order to carry out recording faithful to the image information, therefore, it is necessary to maintain a constant laser beam intensity at all times. Since the intensity of the laser beam emitted from the semiconductor laser is easily influenced by the temperature, feedback control is effected on the laser beam emitted from the semiconductor laser as noted above.

The laser beam emission raises the temperature of the semiconductor laser. On the other hand, it is known that the excitation current to be applied to the semiconductor laser for causing the semiconductor laser to emit a laser beam of a certain intensity depends on the semiconductor laser temperature, and the higher temperature requires a greater quantity of excitation current.

It often is the case with the laser applied machinery noted above that the laser beam is not emitted at all times but is emitted only when necessary, for example, only when recording is carried out. The semiconductor laser temperature begins to lower gradually when the laser beam emission is broken such as upon completion of recording after a continuous emission of the laser beam. After the laser beam emission ceases, the laser drive device retains the excitation current as received at the time of emission stoppage.

Consequently, when the laser beam emission is resumed, the excitation current is temporarily applied to the semiconductor laser in a greater quantity than is necessary for causing the laser beam emission even though the semiconductor laser has a low temperature. This is likely to deteriorate or damage the semiconductor laser.

In order to avoid such an inconvenience, a proposal has been made to cause the semiconductor laser to emit the laser beam at fixed intervals when the semiconductor laser does not emit the laser beam continuously, and to control the quantity of the excitation current by using the output from the photoreceptor means.

According to the above proposal, however, the laser beam must be emitted at fixed intervals during a waiting time when recording is not carried out and a continuous emission of the laser beam is unnecessary. It inevitably results in an elongated operating time of the semiconductor laser, which could well shorten the life of the semiconductor laser.

SUMMARY OF THE INVENTION

Having regard to the above state of the art, the present invention has for an object to shorten the operating time of the semiconductor laser to a minimum while avoiding the excitation current being applied to the semiconductor laser in a greater quantity than is necessary when the semiconductor laser is actuated after an interruption.

In order to fulfill the above object, the present invention is directed to the provision of an improved laser emitting apparatus in which semiconductor laser drive means is controlled by a signal from a laser beam feedback system so that an optimal laser beam is emitted from the semiconductor laser and, when an interrupt signal is generated for interrupting the laser beam emission, the drive means is controlled to cause the semiconductor laser to emit a laser beam of minimum level.

In accordance with one of the preferred embodiments of the invention, for example, there is provided a laser emitting apparatus comprising a semiconductor laser; drive means for applying an excitation current to the semiconductor laser to cause the semiconductor laser to emit a laser beam; photoreceptor means for detecting intensity of the laser beam emitted from the semiconductor laser and outputting a signal corresponding to the intensity of the laser beam; first control means operable in response to the signal output from the photoreceptor means for controlling intensity of the excitation current output from the drive means in order to maintain the laser beam emitted from the semiconductor laser at a predetermined intensity; interrupt signal output means for outputting a signal for interrupting emission of the laser beam; and second control means operable in response to the signal output from the interrupt signal output means for reducing the excitation current below a predetermined intensity level regardless of controls effected by the first control means.

In a different embodiment of the invention, the control means accepts the signal from the photoreceptor means during each predetermined period, is operable in response to this signal to control output of the excitation current from the drive means in order to maintain the laser beam emitted from the semiconductor laser at a predetermined intensity, and retains this state till acceptance of a next signal from the photoreceptor means, and cancel means is provided which is operable in response to the signal output from the interrupt signal output means for cancelling the state retained by the control means.

The foregoing object may also be fulfilled by providing control means operable in response to the signal output from the photoreceptor means for controlling intensity of the excitation current output from the drive means in order to maintain the laser beam emitted from the semiconductor laser at a predetermined intensity, and means operable in response to the signal output from the interrupt signal output means for outputting a signal such as a psuedo-signal which is equivalent to a signal output from the photoreceptor means when the photoreceptor means receives a laser beam exceeding the predetermined intensity.

The laser emitting apparatus having the above construction functions such that the excitation current is increased when the laser beam received by the photoreceptor means is below a reference intensity, and is reduced when the laser beam exceeds the reference intensity.

An interruption in the excitation current output from the laser drive means, for example, with the completion of recording, takes place after a continuous laser beam emission over a certain period of time as already described. At this time the semiconductor laser has a high temperature, and the laser drive means is in a condition to output the excitation current in a great quantity.

In this state, the control means functions to cause output of a low level excitation current as when the photoreceptor means receives a laser beam exceeding the predetermined intensity.

Thus, the laser emitting apparatus according to the present invention forcibly reduces the excitation current when the excitation current applied to the semiconductor laser is interrupted. This is effective to avoid an excessive excitation current being applied to the semiconductor laser when the laser beam emission is resumed after an interruption, without emitting the laser beam during a break in the recording.

As a result, the operating time of the semiconductor laser is minimized, thereby to elongate the life of the semiconductor laser.

BRIEF DESCRIPTION OF THE DRAWINGS

These and other objects, advantages and features of the present invention will become apparent from the following description of preferred embodiments thereof taken in conjunction with the accompanying drawings, in which:

FIG. 3 is a schematic view illustrating a laser beam printer construction.

DETAILED DESCRIPTION OF THE PREFERRED EMBODIMENT

Figure 1:
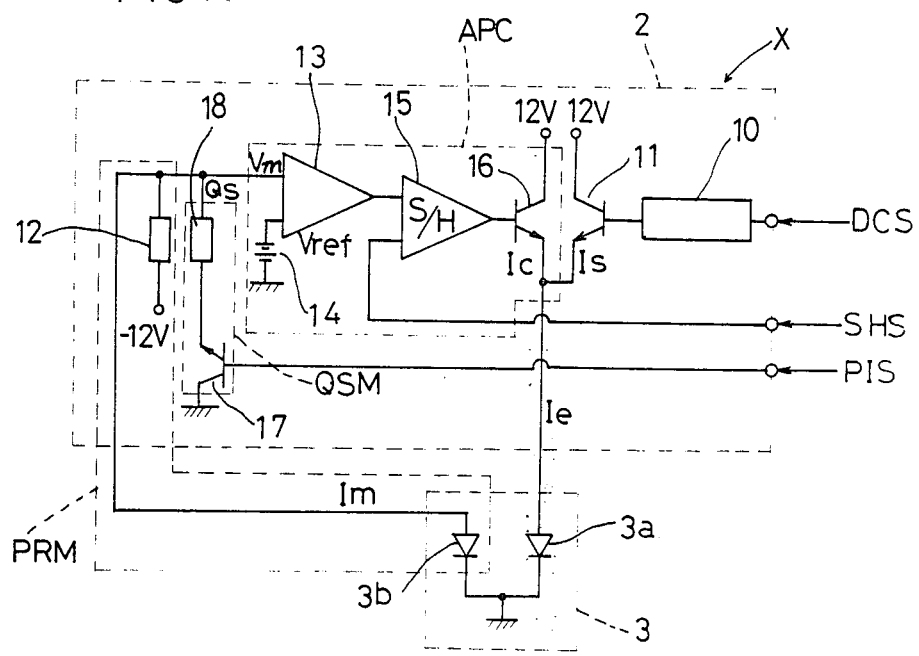
FIG. 1 is a block diagram of a laser emitting apparatus embodying the present invention.

An embodiment of the present invention will be described hereinafter with reference to the drawings.

FIG. 3 is a schematic view of a laser beam printer including a laser emitting apparatus X according to the present invention.

The laser beam printer comprises an image control circuit 1 including an image memory 1a from which image information to be recorded is read and input to a laser drive device 2. The laser drive device 2 applies an excitation current corresponding to the image information to a semiconductor laser 3a in a laser head 3. The semiconductor laser 3a emits a laser beam B directly modulated by the excitation current.

The laser beam B is collimated by a collimator lens 4 and reflected by reflecting surfaces 5a of a polygonal mirror 5 in high speed rotation. The reflected laser beam B is condensed by an fθ lens 6 onto a photosensitive drum 7 having a uniformly charged surface, thereby attenuating a charge potential at an image forming position according to the intensity of the beam.

Each of the reflecting surfaces 5a has inclinations varying with the rotation of the polygonal mirror 5, with respect to the collimated laser beam B incident thereon. This causes the reflected laser beam B to scan the photosensitive drum 7 longitudinally (which constitutes a main scanning direction).

On the other hand, the photosensitive drum 7 is rotatable at a constant speed (the direction of rotation of the drum 7 constituting an auxiliary scanning direction).

The laser beam B repeatedly scans the photosensitive drum 7 in rotation, thereby forming an electrostatic latent image corresponding to the image information on the drum 7.

Though not illustrated, coloring pigments as toners are then selectively adhered to the electrostatic latent image to develop the image. The image is transferred to recording paper placed in tight contact with the drum surface carrying the toners. Thereafter, heat is applied to fuse the toner and fix it to the recording paper, thereby to obtain an image output.

This printer further comprises a photosensor 8 disposed forwardly of the photosensitive drum 7 with respect to the main scanning direction. The photosensor 8 outputs an photoelectric current when the laser beam B makes a scan after being reflected by the polygonal mirror 5. The photoelectric current is shaped by a waveform shaping circuit 9 and is input to the image control circuit 1 as a synchronizing signal SOS after a fixed time, that is after a time period corresponding to a time taken by the scanning laser beam B to move from the photosensor 8 to a recording start position on the photosensitive drum 7.

Upon receipt of the synchronizing signal SOS, image information for one line is read out of the image memory 1a in the image control circuit 1. In response to the image information read out of the image memory 1a, the laser drive circuit 2 begins to apply the excitation current to the semiconductor laser 3a.

The synchronizing signal SOS serves the purpose of justifying starting positions of the electrostatic latent image formed by the repeated scanning of the laser beam B in the direction of rotation of the photosensitive drum 7, namely in the auxiliary scanning direction.

More particularly, there is a slight fabricating error in angular dividing precision of the reflecting surfaces 5a of polygonal mirror 5. There are also irregularities of and vibrations occurring with the rotation of polygonal mirror 5. These may result in an unjustified scanning area of the laser beam B in the auxiliary scanning direction, which causes a jitter in the recorded image.

To avoid the jitter in the recorded image, the modulation of the laser beam B for scanning the photosensitive drum 7 is started under control based on the time of reception by the photosensor 8 of the laser beam B.

On the other hand, the laser head 3 includes a photodiode 3b for receiving the laser beam B emitted from the semiconductor laser 3a. The photodiode 3b outputs a signal to the laser drive device 2. This output signal of the photodiode 3b is used to control the excitation signal for the semiconductor laser 3a so that the laser beam B emitted therefrom always has a constant intensity regardless of temperature variations and other factors.

A further explanation will be made of the construction and operation of the laser emitting apparatus X comprising the laser drive device 2 and the laser head 3.

As shown in FIG. 1, the image information read out of the image memory 1a is input as drive control signal DCS to a switching section 10. The switching section 10 switches a transistor 11 on and off in accordance with the image information. This generates a recording current Is which combines with a control current Ic generated by a transistor 16 to be described later, to form excitation current Ie for application to the semiconductor laser 3a in the laser head 3.

On the other hand, the drive control signal DCS is input from the image control circuit 1 to the switching section 10 to emit the laser beam B to a portion adjacent the photosensor 8 other than the image forming area. While the laser beam B is emitted to the portion adjacent the photosensor 8 in response to the drive control signal DCS, the intensity of laser beam B is monitored by using the photodiode 3b in the laser head 3.

The photodiode 3b outputs photoelectric current Im which is transformed by a resistor 12 into a voltage signal Vm. This voltage signal Vm is input to an operational amplifier 13 and compared with a reference voltage Vref input thereto from a reference power source 14. The output of the operational amplifier 13 is input to a voltage hold element 15 and is held there in response to a sample hold signal SHS input from the image control circuit 1.

The voltage hold element 15 provides an output for varying the control current Ic flowing through the transistor 16. As a result, the semiconductor laser 3a receives the excitation current Ie which is a sum of the control current Ic and the recording current Is from the transistor 11 and which is controlled to maintain the laser beam B emitted from the semiconductor laser 3a to be constant at all times.

Thus, the photodiode 3b, resistor 12, etc. constitute photo reception means PRM, and the operational amplifier 13, voltage hold element 15, transistor 16, etc. constitute control means APC.

The operational amplifier 13 has an input terminal connected to a resistor 18 which is connected to the emitter of a transistor 17. The base of this transistor 17 receives a recording interrupt signal PIS output from the image control circuit 1. When this recording interrupt signal PIS is received, the input to the operational amplifier 13 has the same level as when the photodiode 3b receives the laser beam B of maximum intensity, regardless of the quantity of photoelectric current Im from the photodiode 3b.

More particularly, the semiconductor laser 3a becomes heated as a result of continuous recording. The output of semiconductor laser 3a is temperature-dependent, and the higher temperature requires the greater quantity of excitation current Ie. When the recording is interrupted, the voltage hold element 15 holds a value corresponding to the control current Ic that sets the laser beam B to a predetermined reference intensity. This control current Ic has a very large quantity since the semiconductor laser 3a is heated.

Consequently, the control current Ic is generated in a very large quantity when the recording is resumed although the semiconductor laser 3a has been cooled. The excitation current Ie applied to the semiconductor laser 3a, therefore, temporarily becomes greater than is necessary, which tends to damage or deteriorate the semiconductor laser 3a.

In order to avoid this situation, a false signal QS is input to the operational amplifier 13 when the recording is interrupted, which false signal is equivalent to the signal input to the operational amplifier 13 when the photodiode 3b receives a laser beam B exceeding the reference intensity. The control means APC is operable in response to this false signal to reduce the control current Ic. This prevents the excitation current Ie from being applied in an unnecessarily large quantity to the semiconductor laser 3a when the recording is resumed.

Thus, the transistor 17 and resistor 18 constitute false signal output means QSM for outputting the false signal or psedudosignal QS when recording is interrupted.

Figure 2:
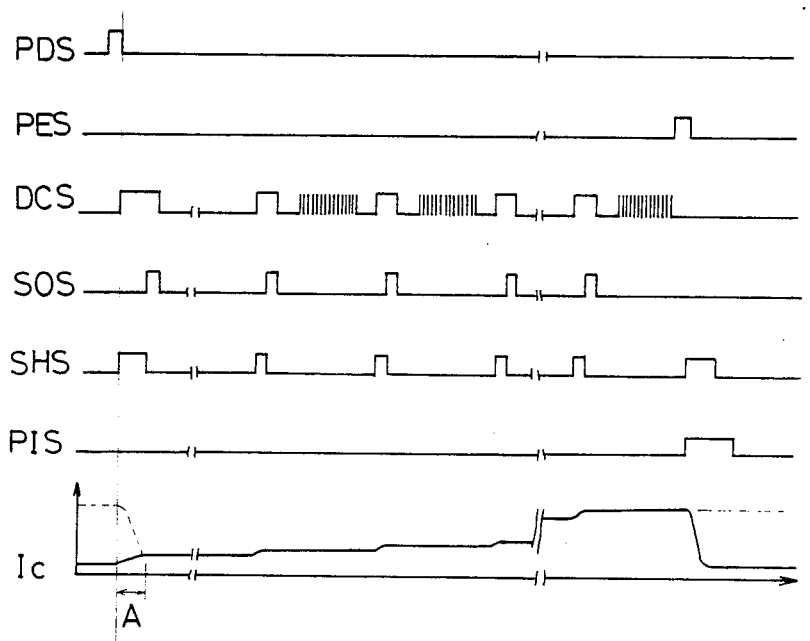
FIG. 2 is a time chart illustrating an operation of the laser emitting apparatus.

The control means APC and false signal output means QSM control the operation of the laser beam printer as illustrated by the time chart of FIG. 2.

When the image control circuit 1 receives a print demand signal PDS from a host computer not shown, the drive control signal DCS is set to high level for a fixed period to obtain the synchronizing signal SOS, and the sample hold signal SHS is set to high level for a fixed period to monitor the intensity of laser beam B by means of the photodiode 3b.

Thereafter, the drive control signal DCS is input which corresponds to the image information read out of the image memory 1a, whereby the excitation current Ie is applied to the semiconductor laser 3a. When, during each scan, recording corresponding to the image information is not effected, that is a period corresponding to the portion adjacent the photosensor 8 other than the image forming area, the drive control signal DCS and the sample hold signal SHS are set to high level for the fixed periods as when the print demand signal PDS is input.

At this time the intensity of laser beam B is monitored by means of photodiode 3b. The control current Ic flowing through the transistor 16 gradually increases with a temperature rise of semiconductor laser 3a as shown.

When a series of recording is completed, a print end signal PES is input from the host computer to the image control circuit 1. Upon receipt of this signal, the recording interrupt signal PIS and the sample hold signal SHS output from the image control circuit 1 are set to high level for fixed periods, respectively.

Consequently, as already described, the operational amplifier 13 receives the false signal QS equivalent to the signal output when the photodiode 3b receives the laser beam B of maximum intensity. The control current Ic is reduced as a result of the output signal of operational amplifier 13 being held at the voltage hold element 15.

FIG. 2 shows, in broken lines, variations of the control current Ic occurring when the false signal output means QSM is kept out of operation. In this case, the control current Ic remains at a high level for a moment (referenced A in the drawing) after the recording is resumed. This could result in the excitation current being applied in a greater quantity than is necessary to the semiconductor laser 3a cooled during a recording interruption.

The specific constructions of the photoreceptor means PRM and control means APC may be varied as appropriate. The false signal output means QSM is also variable in many ways. For example, the resistor 12 may be of variable resistance or rank resistance whose resistance value is forcibly variable upon receipt of the recording interrupt signal PIS.

In the foregoing embodiment, the laser emitting apparatus according to the present invention is applied to an indirect type laser beam printer which causes the laser beam B to scan the photosensitive drum 7 to form an electrostatic latent image, develops the latent image and transfers it to recording paper. The laser emitting apparatus according to the present invention is applicable also to a direct type laser beam printer which causes the laser beam B to scan and form an image on photosensitive paper directly. In addition to these laser beam printers, the laser emitting apparatus according to the present invention may be applied to a laser COM system for photographing microimages onto a microfilm, a laser imager for photographing CT (computer tomography) images onto a silver chloride film and the like.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A laser emitting apparatus comprising:
    a semiconductor laser;
    drive means for applying an excitation current to said semiconductor laser to cause said semiconductor laser to emit a laser beam;
    photoreceptor means for detecting intensity of the laser beam emitted from said semiconductor laser and for outputting a detecting signal corresponding to the intensity of the laser beam;
    control means responsive to said detecting signal for controlling said drive means so as to vary the excitation current to be applied to said semiconductor laser in order to maintain the laser beam emitted from said semiconductor laser at a predetermined intensity;
    interrupt signal output means for outputting an interrupt signal for interrupting emission of the laser beam, and
    psuedosignal generating means responsive to said interrupt signal for generating a pseudo-signal equivalent to the detecting signal outputted from said photoreceptor means when said photoreceptor means receives a laser beam exceeding the predetermined intensity and for outputting the psuedosignal to said control means in place of the detecting signal.

2. A laser emitting apparatus as claimed in claim 1, wherein said control means accepts the detecting signal from the photoreceptor means at predetermined periods to control the drive means and retains this state during each period, said psuedosignal cancels the state retained by the control means.

3. A laser emitting apparatus as claimed in claim 1, wherein the excitation current applied to said semiconductor laser comprises a first current and a second current superimposed upon each other, the first current being varied under control by said control means, and the second current being binarized in order to modulate the laser beam emitted from said semiconductor laser.

4. In a laser emitting apparatus having a semiconductor laser which generates a laser beam by applying an excitation current, the improvement comprising:
    means for actuating the semiconductor laser by applying the excitation current thereto;
    means for detecting an intensity of the laser beam emitted by the semiconductor laser to generate a first signal corresponding to the detected intensity of the laser beam;
    means for providing a reference signal representing a reference intensity of the laser beam;
    means for varying the excitation current in response to the first signal and the reference signal; and
    means for generating a second signal greater than the reference signal and applying it to said varying means in place of the first signal when the semiconductor laser is not activated to lower the excitation current when the semiconductor laser is reactivated.

5. A method for driving a semiconductor laser, comprising the steps of:
    applying an excitation current to the semiconductor laser to make it emit a laser beam;
    generating a first signal representing the intensity of the laser beam emitted by the semiconductor laser;
    comparing the first signal with a reference signal representing the desired intensity of the laser beam;
    controlling the excitation current in response to the comparison result, and
    generating a second signal in place of the first signal when the emission of the laser beam is ceased in order to lower the excitation current to be applied to the semiconductor laser when the emission of the laser beam is resumed.

* * * * *